(12) United States Patent
Curt et al.

(10) Patent No.: US 7,969,159 B2
(45) Date of Patent: Jun. 28, 2011

(54) METHOD AND APPARATUS FOR AN ELECTRICAL CONDUCTOR MONITORING SYSTEM

(75) Inventors: Walter Curt, Harrisonburg, VA (US); Christopher Mullins, Penn Laird, VA (US)

(73) Assignee: Power Monitors, Inc., Mount Crawford, VA (US)

( * ) Notice: Subject to any disclaimer, the term of this patent is extended or adjusted under 35 U.S.C. 154(b) by 338 days.

(21) Appl. No.: 12/178,399

(22) Filed: Jul. 23, 2008

(65) Prior Publication Data

US 2009/0027061 A1 Jan. 29, 2009

Related U.S. Application Data

(60) Provisional application No. 60/951,921, filed on Jul. 25, 2007, provisional application No. 60/951,893, filed on Jul. 25, 2007.

(51) Int. Cl.
*G01R 31/08* (2006.01)

(52) U.S. Cl. ........................................ 324/539; 324/555
(58) Field of Classification Search .................. 324/539, 324/537, 500, 555, 76.11
See application file for complete search history.

(56) References Cited

U.S. PATENT DOCUMENTS

| | | | |
|---|---|---|---|
| 6,212,049 B1 * | 4/2001 | Spencer et al. ................. | 361/64 |
| 2006/0047543 A1 | 3/2006 | Moses | |
| 2007/0286089 A1 * | 12/2007 | Nasle et al. .................... | 370/245 |
| 2008/0224617 A1 * | 9/2008 | Keller et al. .................... | 315/86 |
| 2009/0115426 A1 * | 5/2009 | Muench et al. ................ | 324/537 |
| 2009/0167308 A1 * | 7/2009 | Lomes ........................... | 324/326 |

* cited by examiner

*Primary Examiner* — Hoai-An D Nguyen
(74) *Attorney, Agent, or Firm* — K&L Gates LLP

(57) ABSTRACT

A system and method for determining the status of each monitored conductor, and optionally indicating peak current or other parameters are provided. Wireless self-powered sensor elements can eliminate much of the wiring required in traditional systems, and greatly ease the installation in difficult underground locations.

18 Claims, 5 Drawing Sheets

METHOD AND APPARATUS FOR AN ELECTRICAL CONDUCTOR MONITORING SYSTEM

RELATED APPLICATIONS

This application claims priority to U.S. Provisional Application Ser. No. 60/951,893, filed Jul. 25, 2007 and entitled "METHOD AND APPARATUS FOR A LOW-POWER RADIO BROADCAST ALERT FOR MONITORING SYSTEMS" and U.S. Provisional Application Ser. No. 60/951,921, filed Jul. 25, 2007 and entitled "METHOD AND APPARATUS FOR AN ELECTRICAL CONDUCTOR MONITORING SYSTEM", the entire contents of which are hereby incorporated by reference.

BACKGROUND

High-density urban areas often use an underground network grid to distribute electrical power. In this situation, a grid of transformers convert high-voltage (13 kV or greater) feeds from substations into low voltage (under 600V, typically 120V) secondaries. These secondary conductors are connected in parallel, providing a redundant link. The secondary conductors are often 500 MCM copper, with rubber/neoprene insulation. A typical vault or service box would contain a three phase service, and each phase would consist of two parallel 500 MCM conductors from a network transformer. Usually there are two or more sets of these, also connected in parallel. Thus, there may be 6, 12, or 18 500 MCM copper wires, with 2, 4, or 6 or more wires for each phase. The neutral (e.g., a circuit conductor that may carry current in normal operation, and which is often connected to earth/ground) is also paralleled, but sometimes with fewer conductors.

Although the network grid system is very reliable, periodic maintenance is required, and equipment breakdowns do occur. It is costly and time-consuming to enter an underground vault, due to safety issues as well as logistical issues (e.g. blocking traffic, unwelding manhole covers, etc.) Consequently, the electrical utility often cannot economically monitor the state of the network system.

One failure type is a cable fault. When a cable fault occurs, extremely high currents flow, and this often causes severe damage to the cable, and even to nearby cables. To prevent this, cable limiters are used. These are fast-acting fuses that are designed to open before the cable insulation itself is damaged. They are not designed for overload protection, just fault current protection. These are typically placed in series with each conductor, at every junction and access point in the secondary grid. Doing that minimizes the repair work needed after a fault, and limits the damage to the single faulty cable.

The redundant nature of the grid insures that if a single cable fails, the limiter removes it from the circuit, and the rest of the cables absorb the load. Gradually the capacity of the secondary network is degraded as more faults occur over time. Since the network continues to function, and underground cable inspection is very costly, the utility has no easy way to determine how quickly this is happening, or where the faulty cables are in the network.

SUMMARY

In various embodiments, a system and method for determining the status of each monitored conductor, and optionally indicating peak current or other parameters are provided. Wireless self-powered sensor elements can eliminate much of the wiring required in traditional systems, and greatly ease the installation in difficult underground locations.

In one embodiment, an electrical conductor monitoring system includes at least one sensor element connected to at least one electrical conductor, wherein the at least one sensor element monitors and collects at least one operating statistic of the electrical conductor and transmits at least one message containing the at least one measured operating statistic, a communications node operable to receive the at least one transmitted message from the at least one sensor element, wherein the communication node retransmits the at least one received message, and a central server operable to receive and display the at least one retransmitted message from the communications node.

In one embodiment, the sensor element is operable to communicate with the communication node through a local area network and the communication node is operable to communicate with the central server through a wide area network. In one such embodiment, the local area network connecting the sensor element and the communication node is a wireless communication link.

In one embodiment, the at least one sensor element and the at least one communication node are located in a hazardous location. In one such embodiment, the hazardous location is an underground vault that is part of an underground power distribution grid network.

In one embodiment, the sensor element transmits a plurality of messages containing at least one measured operating statistic and the communications node is operable to receive the plurality of messages transmitted from the sensor element and aggregate the measured operating statistics contained in the plurality of messages.

In an alternative embodiment, a plurality of sensor elements are each connected to at least one of a plurality of electrical conductors, wherein each of the sensor elements monitors and collects at least one operating statistic of the connected electrical conductor and transmits at least one message containing the at least one operating statistic. In one such embodiment, the communication node is operable to receive each message transmitted from the plurality of sensor elements and aggregate the received messages.

In one embodiment, the at least one sensor element draws at least part of the sensor element's power requirement from the connected electrical conductor. In an alternative embodiment, the at least one communication node broadcasts alerts directly to a user.

In one embodiment, a method of monitoring an electrical conductor includes collecting at least one measured operating statistic of an electrical conductor through a sensor element connect to the electrical conductor, generating and transmitting at least one message containing the at least one measured operating statistic, receiving the at least one transmitted message from the at least one sensor element at a communications node, retransmitting the at least one message received from the at least one sensor element, and receiving and displaying at a central server the at least one retransmitted message from the communications node.

In one embodiment, the method includes transmitting and receiving a message between the sensor element and the communication node occur through a local area network and the steps of retransmitting and receiving a message between the communication node and the central server occurs through a wide area network.

In one embodiment, the method includes transmitting and receiving a message between the sensor element and the communication node occur through a wireless communication link.

In one embodiment, the method further includes placing the at least one sensor element and the at least one communication node in a hazardous location. In one such embodiment, the hazardous location is an underground vault that is part of an underground power distribution grid network.

In one embodiment, the method further includes transmitting a plurality of messages containing at least one measured operating statistic from the sensor element, receiving the plurality of broadcast messages at the communications node, and aggregating the measured operating statistics contained in the plurality of messages.

In one embodiment, the method further includes connecting each of a plurality of sensor elements to at least one of a plurality of electrical conductors, monitoring and collecting at least one operating statistic of each connected electrical conductor, and transmitting at least one message containing the at least one operating statistic from each of the plurality of sensor elements. In one such embodiment, the method includes receiving each message broadcast from the plurality of sensor elements at the communication node and aggregating the received messages at the communication node.

In one embodiment, the method includes drawing at least part of the sensor element's power requirement from the connected electrical conductor. In an alternative embodiment, the method includes broadcasting at least one alert from the communication node directly to a user.

Additional features and advantages are described herein, and will be apparent from, the following Detailed Description and the figures.

DETAILED DESCRIPTION

In various embodiments as illustrated in FIGS. 1-5, a distributed system of sensor elements, communication nodes, and a central reporting application server communicate to monitor statistics of electrical conductors. In one embodiment, an electrical conductor is a transformer or a power line; however, it should be appreciated that an electrical conductor is any suitable electrical device. A sensor element is a device that connects to an electrical conductor to be monitored. A communication node is a device that receives messages and data from the sensor elements, aggregates the data, and relays it to either another communication node, out to a network connection (e.g, a LAN or WAN network), or broadcasts an alert if needed. The central reporting application server receives messages from the communication nodes directly, or through an intermediate network connection (e.g., a LAN or WAN connection). It should be appreciated that the above elements are not required and/or can be replaced by any suitable element configured for any suitable purpose.

Figure 1:
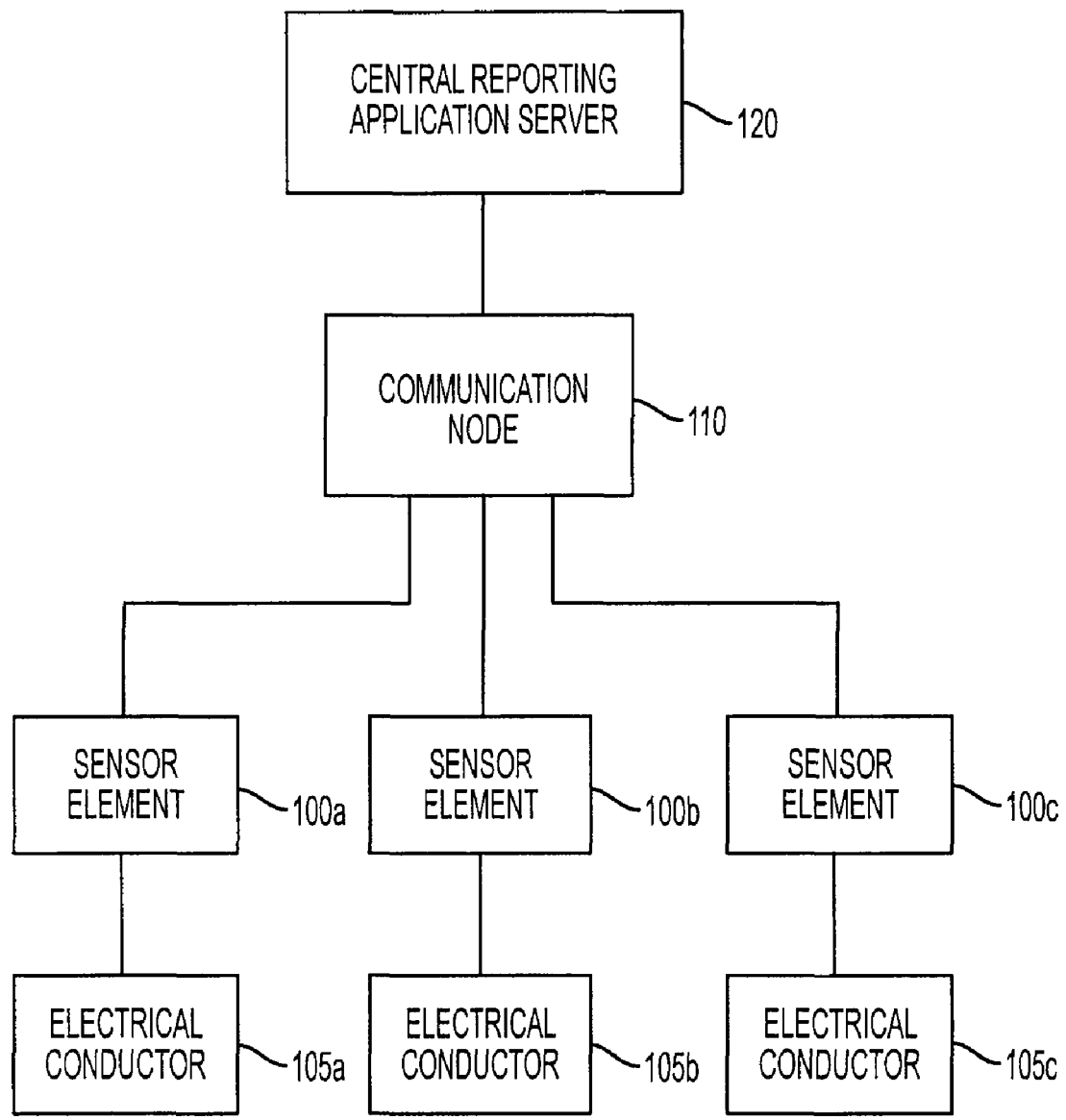
FIG. 1 is a diagram of an electrical conductor monitoring system in accordance with one embodiment.

Referring to FIG. 1, in one embodiment, a plurality of sensor elements 100a-100c are each connected to an electrical conductor to capture and record at least one statistic of the monitored electrical conductors 105a-105c (e.g., peak voltage of the electrical conductors 105a-105c or any other suitable function or operating characteristic of the monitored electrical conductors 105a-105c). The sensor elements 100a-100c are also configured to communicate with a communication node 110; however, it should be appreciated that the sensor element can be configured to communicate with any suitable device. More specifically, the sensor elements 100a-100c are configured to transmit at least one message to the communication node 110 regarding the at least one recorded statistic of the monitored electrical conductors 105a-105c. The communication node 110 is configured to transmit any received messages from the sensor elements 100a-100c to a central reporting application server 120.

Figure 2:
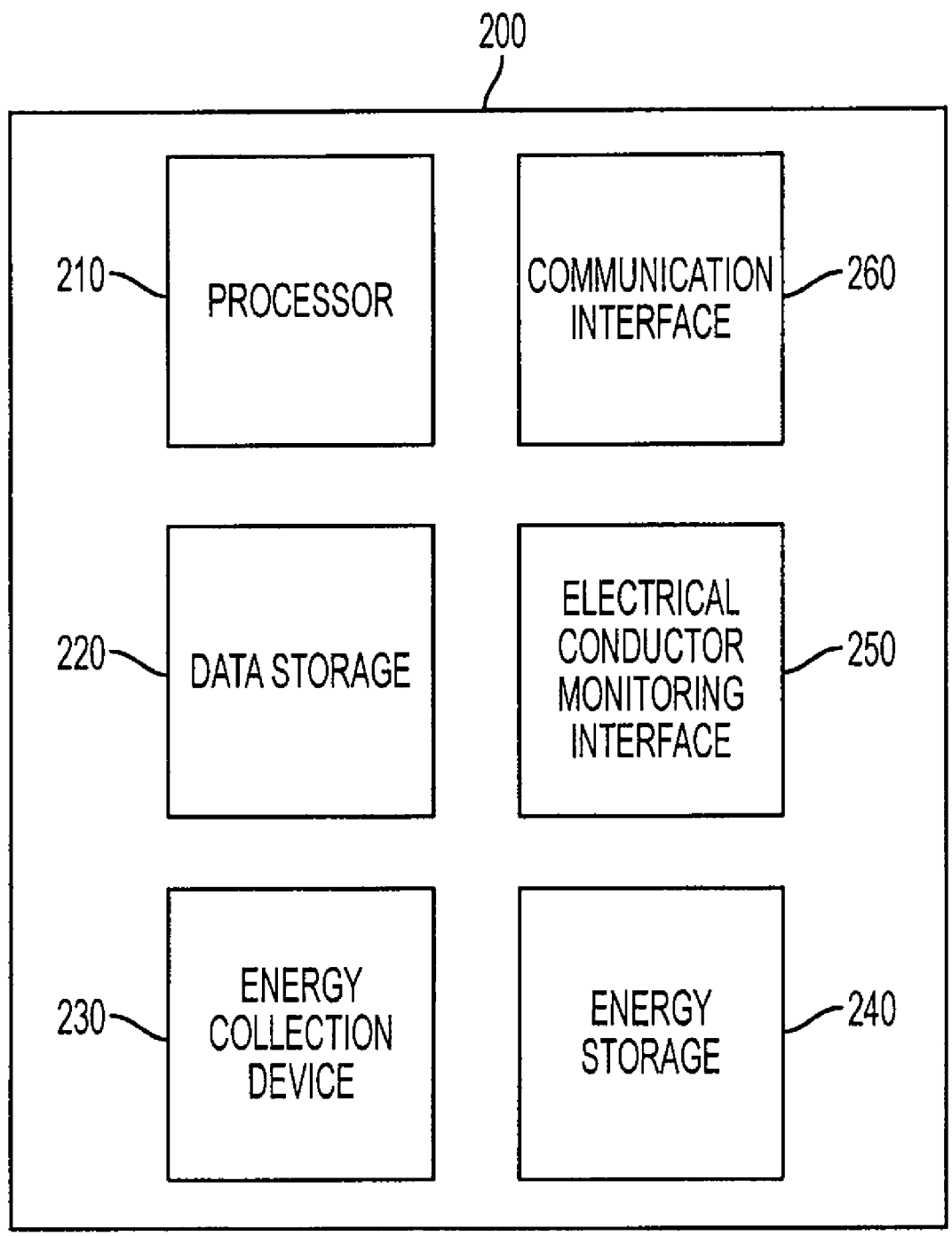
FIG. 2 is a diagram of a sensor element in accordance with one embodiment.

In one embodiment, as illustrated in FIG. 2, sensor element 200 includes a plurality of components. In one embodiment, sensor element 200 includes a processor 210 component for handling computing tasks such as processing captured data of a monitored electrical conductor and writing the captured data to a storage device. The processor 210 can also handle or assist in other processing tasks of the sensor element 200 such as communicating with a communication node. It should be appreciated that the processor can be configured to process any suitable task or assist other sensor element 200 components in completing processing tasks. In one embodiment, sensor element 200 includes data storage 220 for storing collected electrical conductor data for long term and/or short term storage. The data storage 220 can be static RAM, dynamic RAM, optical storage, or any other suitable storage component. It should be appreciated that sensor element 200 may not include any long term storage and immediately forward any captured statistical data to a communication node. In one embodiment, sensor element 200 includes and energy collection component 230 and an energy storage component 240. The energy collection component 230 and energy storage component 240 can harvest electrical energy from the electrical conductor being monitored for data collection purposes and to provide at least part or all of the power requirements of the sensor element 200. Alternatively, sensor element 200 can receive electrical power from electrical outlets, solar panels, or from any other suitable source.

In one embodiment, sensor element 200 includes an electrical conductor monitoring interface component 250. The electrical conductor monitoring interface component 250 enables the sensor element to connect to the electrical conductor to measure at least one statistic of the electrical conductor (e.g., temperature or peak voltage). Sensor element 200 may also use the electrical conductor monitoring interface component 250 to draw electrical power to provide the power requirements for sensor element 200. It should be appreciated that electrical conductor monitoring interface component 250 can include any number of suitable components for measuring any desired feature of the connected electrical conductor. It should also be appreciated that electrical conductor monitoring interface component 250 may include a plurality of different components for measuring a plurality of features of the connected electrical conductor simultaneously or asynchronously. In one embodiment, sensor element 200 also includes a communication interface component 260. The communication interface 260 may include hardware or software to connect to a local wireless network or to a hard wired Ethernet connection, enabling communication with a communication node. However, it should be appreciated that the communication interface 260 can be any suitable network interface for connecting to any suitable network. It should also be appreciated that communication interface 260 can also be configured to connect to any suitable device (e.g., devices other than a communication node in one embodiment).

In one embodiment, the communication node may comprise an IBM or Macintosh compatible personal computer that includes components (e.g., a general purpose CPU, data storage, graphics card, OS, application programs, etc.) that enable it to function as a general purpose personal computer in addition to performing functions of the communication nodes. However it should be appreciated that the communication node may include any suitable set hardware and software components that are focused on receiving and forwarding sensor element messages to a central reporting application server to minimize the cost of the communication node.

In one embodiment the central reporting application server may comprise an IBM or Macintosh compatible personal computer, a workstation, a mini-computer, a mainframe, or other types of computers having at least a microprocessor, disk storage and some memory for processing. In one embodiment, the central reporting application server may also comprise a NC (network computer) in which there is no disk for storage, or a NC operating in a cloud computing environment where data computation and analysis tasks are distributed and shared over a plurality of computers of the same or different configuration.

In one embodiment, when current is flowing through the monitored conductors, the sensor elements each harvest electrical energy, and periodically transmit a short status message to a nearby communication node (e.g., a communication node with communication range). The status message may be as short as an identifier, or it may also include information such as a peak or real-time current reading, conductor temperature, etc. The communication node receives these messages, and relays them to other nodes, relays them back to the receiving central reporting application server through a LAN/WAN interface, or broadcasts an alert. In one embodiment, a broadcasted alert can be sent directly to a user (e.g., a technician) through email, SMS, audio voice alerts sent through the PSTN or cellular networks, or through any suitable communications method. Alternatively, the communication node may aggregate the status reports, and transmit a single status message or measurement, instead of transmitting each individual message or reading.

Figure 3:
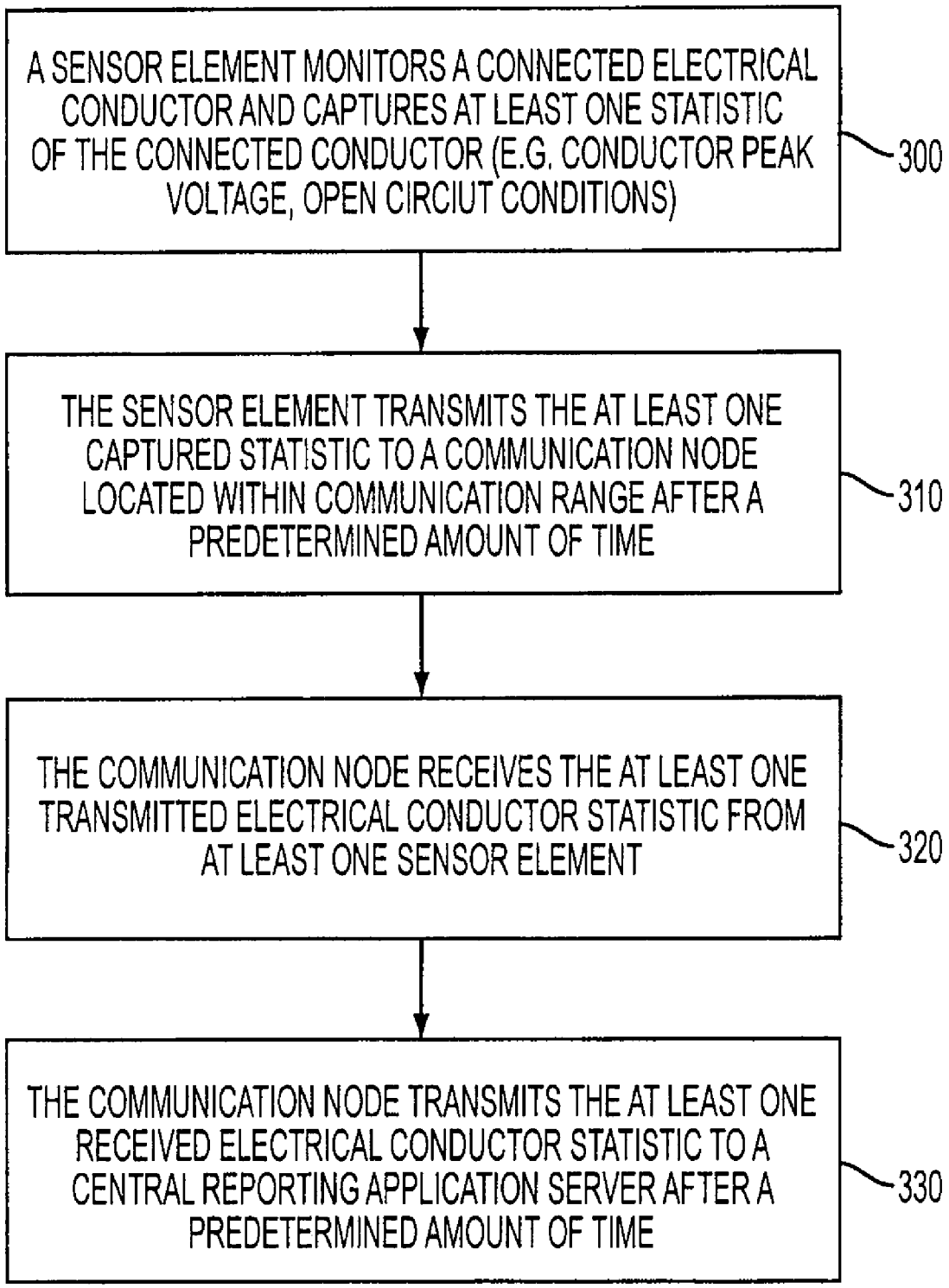
FIG. 3 is a block diagram of a process of monitoring an electrical conductor in accordance with one embodiment.

One process for monitoring electrical conductors is illustrated in FIG. 3. At step 300 a sensor element monitors a connected electrical conductor and captures at least one statistic of the connected conductor (e.g., the conductor's peak voltage, open circuit conditions, etc.). At step 310, the sensor element transmits the at least one captured statistic to communication node located with communication range after a predetermined amount of time. At step 320, the communication node receives the at least one transmitted electrical conductor statistic from the at least one sensor element. At step 330, the communication node transmits the at least one received electrical conductor statistic to a central reporting application server after a predetermined amount of time. In one embodiment, the communication node may transmit the at least one received electrical conductor statistic to a central reporting application server after collecting a predetermined amount of electrical conductor statistical data.

In one embodiment, the sensor elements are self-contained, and powered by the current flowing through the monitored electrical conductor. In this embodiment, the power may be harvested by using a magnetic coupling, or through a Rogowski coil and specialized power harvesting circuitry. Alternatively, the ambient electric field may be used with capacitive coupling, or with a mechanical harvesting system to utilize the 60 Hz vibration of the conductor. A battery or line powered version is also possible, or even an RFID-style system where the communication node broadcasts a burst which powers the sensor element during the sensor read and transmission. A hybrid or mixed approach is also possible.

In one embodiment wherein the sensor element is self powered, the sensor element accumulates energy from the monitored electrical conductor. When enough energy for a transmission has been gathered (or the periodic transmit time has occurred), the element broadcasts a short status message to all available communication nodes in range. This broadcast can be a low power RF or VLF burst, but can also be another communication means, such as power line carrier, infrared, sonic, or any other suitable device or method. In one embodiment, the status message can minimally contain enough information for the communication node to determine that the monitored conductor has not failed (e.g. just the sensor unique identifier, either a globally unique identifier, or unique within range of the communication node); however, the status message is not required to include such minimal information and can include any suitable information. If the sensor element is powered by drawing power from the current through the conductor, then the reception of the signal itself is an indication that the conductor is still functioning. Additionally, the sensor element may harvest enough energy to actually measure the electrical current through the conductor, or may be able to estimate this current based on the energy level harvested, or the time required to harvest a certain amount of energy. This information may also be sent to the communication node, or the communication node may be able to estimate this based on a received signal power level, a time between message bursts, or other signal characteristics which may be correlated (intentionally or as a side-effect of the sensor element operation and construction) with the electrical conductor current. In various embodiments, the minimum energy harvest time or the received signal strength is highly correlated with the monitored current, and can be used to estimate the conductor current. The conversion to actual amperes of current may occur later, based on after-the-fact conversion factors, or may be used to indicate changes in current, rather than absolute current levels (e.g. to indicate increased conductor loading over a period of time). In one embodiment wherein the sensor element is self-powered, a failure to receive a sensor element status message in a predetermined amount of time indicates a likely monitored conductor failure, and would generate an alarm condition. Additionally, in one embodiment, either the communication node or the central reporting application server can track the periods of time between receipt of the sensor element status message.

In one embodiment, a single sensor element can be configured to monitor multiple electrical conductors. In one such embodiment, any one or more of the electrical conductors may provide power for the element, but each individual electrical conductor is monitored for current flow or any other desired statistic as discussed above.

In one embodiment, to increase redundancy and reliability, multiple sensor elements may be used to monitor the same electrical conductor. In one such embodiment, the communication node may be programmed to declare an alert if all sensors on the same conductor indicate a conductor failure; however, the communication node can be programmed in any suitable manner. In another such embodiment, a first sensor element can be configured to monitor a first electrical conductor; however, the first sensor element can be connected to a second electrical conductor to serve as a backup sensor element for the second electrical conductor. If a second sensor element monitoring the second electrical conductor malfunctioned or failed, the first sensor element can be configured to monitor both the first electrical conductor and the second electrical conductor. In one such embodiment, a sensor element can be configured to serve as a backup monitor for any suitable number of electrical conductors.

The sensor element broadcast times are timed to optimally reduce interference from each other in various embodiments. In one embodiment wherein the sensor element is self-powered, the energy harvest time can factors into the broadcast timing, since enough energy must be harvested to transmit a message. However, it should be appreciated that the sensor element can be configured to communicate with communication nodes and/or the central reporting application server using any suitable communication protocol. Thus, in some embodiments, a communication protocol can eliminate or reduce the need to configure the timing of the sensor elements broadcasts.

In one embodiment, the communication node contains suitable circuitry and hardware components to send and receive messages from one or more types of sensor elements. These messages may be sent directly through a network or other concentrator device, where they eventually end up at the central reporting application server. Alternatively, the communication node may rebroadcast received messages and electrical conductor statistics data to other nearby communication nodes (e.g. communication nodes within range of Bluetooth, WiFi, a direct Ethernet connection, or any other known short range communication protocols), distant communication nodes (e.g., communication nodes beyond the range of Bluetooth/WiFi/Ethernet that may require longer range communication protocols such as WiMAX, PPP, ATM, FDDI, various cellular standards, or any other suitable long range communication protocols), or broadcast using low-power FM/AM broadcast bands or other suitable communication protocols directly to users.

In one embodiment where the communication node includes features of a general purpose personal computer, the communication node can be configured for tasks beyond aggregating data and routing the data to the central reporting application server. In one such embodiment, the communication node can be configured to aggregate electrical conductor statistics received from one or more sensor elements and analyze the data for more specific reporting purposes. For example the communication node can be configured to generate a report that the average temperature over a period of time is greater than the tolerances of the electrical conductor which requires the electrical conductor to be replaced because failure is imminent due to the environment conditions. Thus, in one such embodiment, reporting and analysis of the electrical conductor data can be shared with central reporting application server. It should be also appreciated that the communication node can also be configured to directly send alerts to end users (e.g., technicians) detailing the communication node's analysis of the electrical conductor data. In one such embodiment, the communication node can be configured to communicate with end users through a PSTN, SMS, cellular links, email, or any other suitable communication channel.

Figure 4:
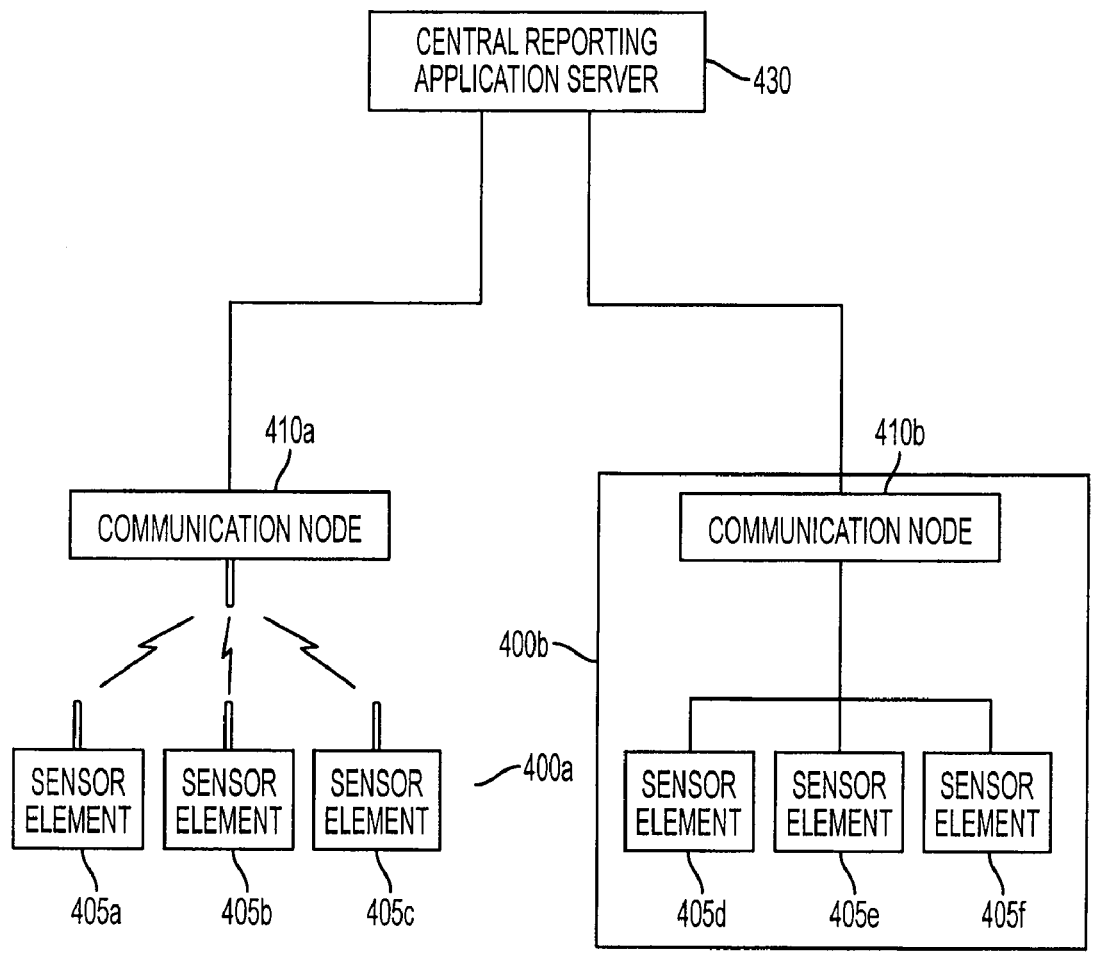
FIG. 4 is a diagram of an electrical conductor monitoring system deployed in an underground power grid network in accordance with one embodiment.

In one embodiment as illustrated in FIG. 4, the monitoring system is deployed in an underground network grid. In one such embodiment, a vault such as vault 400a or vault 400b is positioned underground at least at every city block. Each vault 400a and 400b includes a plurality of sensor elements 405a-405f, wherein each sensor element 405a-405f is connect to at least one electrical conductor (not shown). In one embodiment, due to the self-contained nature of the sensor elements 405a-405c located in vault 400a, sensor elements 405a-405c do not require wiring for communicating with communication node 410a, which is a significant advantage over other methods due to shorter installation times and reduced material costs. In one embodiment, each vault can be configured with wireless communication between sensor elements and the communication node. However, as illustrated in vault 400b, sensor elements 405d-405f can be hard wired to communication node 410b for communication purposes. Thus, it should be appreciated different vaults can be configured with different communication methods as is deemed appropriate based on costs and engineering requirements. Furthermore, in one embodiment, each vault can be configured with at least one communication node; however any suitable number of communication nodes can be present in a vault. In one embodiment, within the vault, sensor elements 405a-405c and 405d-405f send messages to the communication nodes 400a and 400b respectively. The communication nodes 400a and 400b relay the messages upstream to a central reporting software application server 430. The relay communications method may be powerline carrier based (e.g. Hazeltine, Turtle, Opera, HomePlug, INSTEON, etc.), RF (e.g. Bluetooth, WiFi, etc. back to a LAN), or any other suitable method. In one embodiment, additional reporting software application servers may be incorporated into the system depending on the number of vaults being monitored. Thus, different vaults may be configured to send messages to different central reporting application servers.

Figure 5:
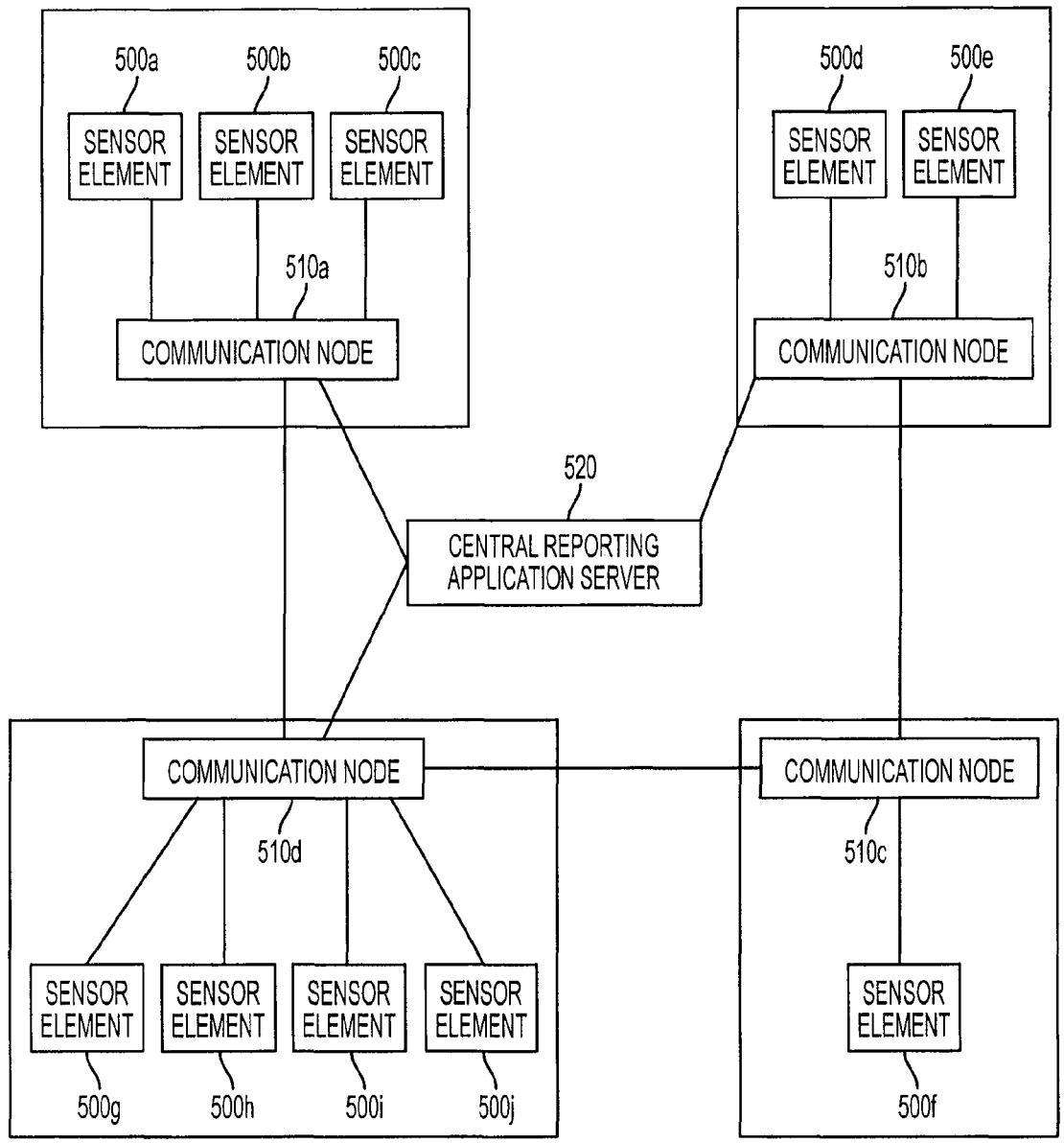
FIG. 5 is a diagram of an electrical conductor monitoring system forming a mesh network in accordance with one embodiment.

In one embodiment as illustrated in FIG. 5, communication nodes can be connected to other communication nodes to form a mesh network. In one embodiment, a communication node may monitor different numbers of sensor elements at different monitored sites. In one such example as illustrated in FIG. 5, communication node 510a receives messages from sensor elements 500a-500c; communication node 510b receives messages from sensor elements 500d and 500e; communication node 510c receives messages from sensor element 500f; and communication node 510d receives messages from sensor elements 500g-500j. In this embodiment, communication node 510a is connected to the central reporting application server 520 and to communication node 510d; communication node 510b is connected to central reporting application server 520 and to communication node 510c; communication node 510c is connected to communication node 510b and communication node 510d; and communication node 510d is connected to communication node 510c, communication node 510a, and to central reporting application server 520. In this example configuration, communication nodes 510a-510d can be configured to transmit the received messages (or aggregated messages) to other nearby communication nodes that are then relayed to the central reporting application server 520 forming a mesh network (e.g., any one or more of the communication nodes 510a-510d can serve as a message aggregator that communicates directly with the central reporting application server 520). In one example of the mesh network, if the link between communication node 510a and central reporting application server 520 becomes unusable, communication node 510a can route messages through communication 510d to central reporting application server 520.

In one embodiment, the underground vault communication nodes (as described in connection with FIG. 4) can also be configured to form a mesh network. In one embodiment, certain vaults also optionally contain more advanced communication nodes, or other communication/data concentrators, that relay messages out of the mesh and onto a LAN/WAN for transmission back to the central reporting application server. Optionally, programming/configuration data for any of the communication nodes 510a-510d and/or the sensor elements 500a-500j may be sent through the mesh network to change at least one device parameter, programming setup, silence alarms, etc. It should also be appreciated that each communication node 510 could be connected to the central reporting application server 520 and each communication node 510 could be connected to one or more communication nodes, or not connected to any communication nodes.

Sensor element and communication node parameters may be programmable in various embodiments. For example, the sensor element status message contents, energy harvesting/collection parameters, etc. may be software or hardware selectable. The communication node relay and aggregation logic, etc. may also be programmable. Additionally, the communication node may log all received sensor element transmissions, especially if they contain measurement data such as current level, or log date/time stamps of alert conditions (e.g. failure of sensor element to broadcast, which indicates that a monitored conductor failed). The recording parameters may also be set in the communication node.

The communication nodes may be programmed with information about the sensor elements within range (e.g. in the same vault), or preferably, it may automatically add sensor elements. In the latter case, when the communication node receives messages from a sensor element, it automatically adds the transmitting sensor element to an internal list of monitored sensor elements. Thus, once the sensor element is added to the list of monitored sensor elements, if the communication node fails to receive a timely status message from the sensor element, an alert condition is triggered.

Alternatively, the communication nodes may not relay messages/data to other communication nodes. In one such embodiment, the communication nodes are normally silent, and only broadcast a message if a conductor has failed (typically indicated by the failure of a sensor element to send a message within a specified amount of time), or a limit has been reached. This broadcast may be through a low power radio transmitter, or indicated by some other suitable alert or annunciator mechanism (e.g. visible strobe light, etc.). If low-power FM/AM broadcast bands are used, users may use a standard broadcast FM/AM radio receiver or other suitable receiver for "drive-by" reception of vault communication node prerecorded or constructed voice messages. In various such embodiments, there may not be a central software system. Status data may be automatically recorded during the drive-by a suitable receiver system, and transmitted to the central software when back in the office, or relayed immediately by an in-vehicle system such as cell phone or other WAN connection. A combination of communication node types may be used, or a single node may incorporate more than one of these methods.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. An electrical conductor monitoring system comprising:
    at least one sensor element connected to at least one electrical conductor in an underground vault that is part of an underground power distribution grid network, wherein the at least one sensor element monitors and collects at least one operating statistic of the electrical conductor and transmits at least one message containing the at least one measured operating statistic;
    a communications node operable to receive the at least one transmitted message from the at least one sensor element, wherein the communication node retransmits the at least one received message; and
    a central server operable to receive and display the at least one retransmitted message from the communications node.

2. The electrical conductor monitoring system of claim 1, wherein the sensor element is operable to communicate with the communication node through a local area network and the communication node is operable to communicate with the central server through a wide area network.

3. The electrical conductor monitoring system of claim 2, wherein the local area network connecting the sensor element and the communication node is a wireless communication link.

4. The electrical conductor monitoring system of claim 1, wherein the at least one sensor element and the at least one communication node are located in a hazardous location.

5. The electrical conductor monitoring system of claim 1, wherein the at least one communication node broadcasts alerts directly to a user.

6. The electrical conductor monitoring system of claim 1, wherein the sensor element transmits a plurality of messages containing at least one measured operating statistic and the communications node is operable to receive the plurality of messages transmitted from the sensor element and aggregate the measured operating statistics contained in the plurality of messages.

7. The electrical conductor monitoring system of claim 1, wherein a plurality of sensor elements are each connected to at least one of a plurality of electrical conductors, wherein each of the sensor elements monitors and collects at least one operating statistic of the connected electrical conductor and transmits at least one message containing the at least one operating statistic.

8. The electrical conductor monitoring system of claim 7, wherein the communication node is operable to receive each message transmitted from the plurality of sensor elements and aggregate the received messages.

9. The electrical conductor monitoring system of claim 1, wherein the at least one sensor element draws at least part of the sensor element's power requirement from the connected electrical conductor.

10. A method of monitoring an electrical conductor comprising:
    collecting at least one measured operating statistic of an electrical conductor through a sensor element connect to the electrical conductor in an underground vault that is part of an underground power distribution grid network;
    generating and transmitting at least one message containing the at least one measured operating statistic;
    receiving the at least one transmitted message from the at least one sensor element at a communications node;
    retransmitting the at least one message received from the at least one sensor element; and
    receiving and displaying at a central server the at least one retransmitted message from the communications node.

11. The method of claim 10, further includes drawing at least part of the sensor element's power requirement from the connected electrical conductor.

12. The method of claim 10, wherein transmitting and receiving a message between the sensor element and the communication node occur through a local area network and retransmitting and receiving a message between the communication node and the central server occurs through a wide area network.

13. The method of claim 10, wherein transmitting and receiving a message between the sensor element and the communication node occur through a wireless communication link.

14. The method of claim 10, further includes placing the at least one sensor element and the at least one communication node in a hazardous location.

15. The method of claim 10, further includes broadcasting at least one alert from the communication node directly to a user.

16. The method of claim 10, further includes transmitting a plurality of messages containing at least one measured operating statistic from the sensor element, receiving the plurality of broadcast messages at the communications node, and aggregating the measured operating statistics contained in the plurality of messages.

17. The method of claim 10, further includes connecting each of a plurality of sensor elements to at least one of a plurality of electrical conductors, monitoring and collecting at least one operating statistic of each connected electrical conductor, and transmitting at least one message containing the at least one operating statistic from each of the plurality of sensor elements.

18. The method of claim 17, further includes receiving each message broadcast from the plurality of sensor elements at the communication node and aggregating the received messages at the communication node.

* * * * *